United States Patent
Solberg

[11] Patent Number: 6,121,676
[45] Date of Patent: Sep. 19, 2000

[54] STACKED MICROELECTRONIC ASSEMBLY AND METHOD THEREFOR

[75] Inventor: Vernon Solberg, Saratoga, Calif.

[73] Assignee: Tessera, Inc., San Jose, Calif.

[21] Appl. No.: 08/987,569

[22] Filed: Dec. 11, 1997

Related U.S. Application Data

[60] Provisional application No. 60/033,353, Dec. 13, 1996.

[51] Int. Cl.⁷ .................................................. H01L 21/60
[52] U.S. Cl. .......................... 257/686; 257/723; 257/724; 257/725; 438/108; 438/109
[58] Field of Search .................................. 257/686, 668, 257/702, 723, 724, 725, 726; 438/107, 108

[56] References Cited

U.S. PATENT DOCUMENTS

| | | | |
|---|---|---|---|
| 3,214,827 | 11/1965 | Phohofsky | 29/624 |
| 3,766,439 | 10/1973 | Isaacson | 439/77 |
| 3,775,844 | 12/1973 | Parks | 29/624 |
| 4,225,900 | 9/1980 | Ciccio et al. | 257/686 |
| 4,941,033 | 7/1990 | Kishida | 257/686 |
| 4,982,265 | 1/1991 | Watanabe et al. | 257/686 |
| 5,046,238 | 9/1991 | Daigle et al. | 29/830 |
| 5,138,438 | 8/1992 | Masayuki et al. | 257/686 |
| 5,148,265 | 9/1992 | Khandros et al. | 257/686 |
| 5,148,266 | 9/1992 | Khandros et al. | 257/686 |
| 5,172,303 | 12/1992 | Bernardoni et al. | 257/686 |
| 5,198,888 | 3/1993 | Sugano et al. | 257/686 |
| 5,222,014 | 6/1993 | Lin | 257/712 |
| 5,247,423 | 9/1993 | Lin et al. | 257/686 |
| 5,281,852 | 1/1994 | Normington | 257/686 |
| 5,313,416 | 5/1994 | Kimura | 439/77 |
| 5,334,875 | 8/1994 | Sugano et al. | 257/686 |
| 5,347,159 | 9/1994 | Khandros et al. | 257/692 |
| 5,390,844 | 2/1995 | DiStefano et al. | 228/212 |
| 5,397,916 | 3/1995 | Normington | 257/686 |
| 5,398,863 | 3/1995 | Grube et al. | 257/668 |
| 5,422,435 | 6/1995 | Takiar et al. | 257/686 |
| 5,426,563 | 6/1995 | Moresco et al. | 257/686 |
| 5,440,171 | 8/1995 | Miyano et al. | 257/724 |

(List continued on next page.)

FOREIGN PATENT DOCUMENTS

| | | |
|---|---|---|
| 0 080 041 A2 | 6/1983 | European Pat. Off. . |
| 2 312 172 | of 0000 | France . |
| WO 94/03036 | 2/1994 | WIPO . |

OTHER PUBLICATIONS

Daryl Ann Doane and Paul D. Franzon, "Packaging Performance Factors," Multichip Module Technologies and Alternatives: The basics, pp. 109–112, ©1993 by Van Nostrand Reinhold.

N. Senba et al., "Application of 3–Dimensional Memory Module," ISHM 1996 Proceedings, pp. 279–284.

*Primary Examiner*—Donald L. Monin, Jr.
*Assistant Examiner*—Michael Dietrich
*Attorney, Agent, or Firm*—Lerner, David, Littenberg, Krumholz & Mentlik, LLP

[57] ABSTRACT

A method of making a stacked microelectronic assembly such as a semiconductor chip assembly and its resulting structure includes providing a flexible substrate having a plurality of attachment sites and conductive terminals and including a wiring layer with leads extending to the attachment sites. The method includes assembling a plurality of microelectronic elements to the attachment sites and electrically interconnecting the microelectronic elements and the leads so that the electrically connected microelectronic elements are movable relative to the flexible substrate. The flexible substrate is then folded so as to stack at least some of the microelectronic elements in substantially vertical alignment with one another to provide a stacked assembly with the conductive terminals exposed at the bottom end of the stack. The stacked assembly is held in place using a thermally conductive adhesive and/or a mechanical element. The stacking structure and methods of the present invention provide an economical and space-saving assembly for use in electronic components. The flexibility of the electrical connection between each microelectronic element and the substrate provides for reliable electrical interconnections between the substrate and the microelectronic elements during thermal cycling.

42 Claims, 6 Drawing Sheets

U.S. PATENT DOCUMENTS

| | | | |
|---|---|---|---|
| 5,448,511 | 9/1995 | Paurus et al. | 257/686 |
| 5,454,160 | 10/1995 | Nickel | 257/778 |
| 5,455,740 | 10/1995 | Burns | 257/686 |
| 5,479,318 | 12/1995 | Burns | 257/686 |
| 5,489,749 | 2/1996 | DiStefano et al. | 438/109 |
| 5,491,302 | 2/1996 | DiStefano et al. | 257/668 |
| 5,536,909 | 7/1996 | DiStefano et al. | 257/668 |
| 5,552,963 | 9/1996 | Burns | 257/686 |
| 5,646,446 | 7/1997 | Nicewarner, Jr. et al. | 257/723 |
| 5,659,952 | 8/1997 | Kovac et al. | 29/840 |
| 5,776,797 | 7/1998 | Nicewarner et al. | 438/107 |

STACKED MICROELECTRONIC ASSEMBLY AND METHOD THEREFOR

CROSS REFERENCE TO RELATED APPLICATIONS

This application claims benefit of United States Provisional patent application Ser. No. 60/033,353 filed Dec. 13, 1996, the disclosure of which is incorporated by reference herein.

FIELD OF THE INVENTION

The present invention relates to microelectronic assemblies and more particularly relates to semiconductor chip assemblies in which a plurality of chips are stacked one atop the other.

BACKGROUND OF THE INVENTION

Semiconductor chips are commonly provided as individual, prepackaged units. A standard chip has a flat, rectangular body with a large front face having contacts for connection to the internal circuitry of the chip. Each individual chip is typically mounted to a substrate or chip carrier, which in turn is mounted on a circuit panel such as a printed circuit board. Considerable effort has been devoted towards development of so-called "multichip modules" in which several chips having related functions are attached to a common circuit panel and protected by a common package. This approach conserves some of the space which is ordinarily wasted by individual chip packages. However, most multichip module designs utilize a single layer of chips positioned side-by-side on a surface of a planar circuit panel. In "flip chip" designs, the front face of the chip confronts the face of the circuit panel and the contacts on the chip are bonded to the circuit panel by solder balls or other connecting elements. The "flip chip" design provides a relatively compact arrangement; each chip occupies an area of the circuit panel equal to or slightly larger than the area of the chip front face. As disclosed, in commonly assigned U.S. Pat. Nos. 5,148,265 and 5,148,266, the disclosures of which are incorporated herein by reference, certain innovative mounting techniques offer compactness approaching or equaling that of conventional flip chip bonding without the reliability and testing problems commonly encountered in that approach.

Various proposals have been advanced for packaging chips in a "stacked" arrangement, i.e., an arrangement where several chips are placed one atop the other whereby several chips can be maintained in an area of the circuit board which is less than the total area of the chip faces, such as disclosed in commonly assigned U.S. Pat. No. 5,347,159, the disclosure of which is incorporated herein by reference. U.S. Pat. No. 4,941,033 discloses an arrangement in which chips are stacked one atop the other and interconnected with one another by conductors on so-called "wiring films" associated with the chips.

Commonly assigned U.S. patent application Ser. No. 08/705,309 filed Aug. 29, 1996, the disclosure of which is incorporated by reference herein, teaches an assembly of semiconductor chips which are vertically stacked one atop the other. One aspect of the invention in the '309 application provides a plurality of semiconductor chip assemblies whereby each assembly includes an interposer and a semiconductor chip mounted thereto. Each interposer also includes a plurality of leads electrically interconnecting the chip and the interposer. The assembly also includes compliant layers disposed between the chips and the interposers so as to permit relative movement of the chips and interposers to compensate for thermal expansion and contraction of the components. The subassemblies are then stacked one atop the other so that the chips overlie one another. Although the approach set forth in the '309 application offers useful ways of making a stacked assembly, still other methods would be desirable.

Stacked chip assemblies should deal effectively with the problems associated with heat generation in stacked chips. Chips dissipate electrical power as heat during operation and where chips are stacked one atop the other, it is difficult to dissipate the heat generated by the chips in the middle of the stack. Consequently, the chips in such a stack may undergo substantial thermal expansion and contraction during operation. This, in turn, imposes significant mechanical stress on the interconnecting arrangements and on the mountings which physically retain the chips. Moreover, the assembly should be simple, reliable and easily fabricated in a cost-effective manner.

SUMMARY OF THE INVENTION

One aspect of the present invention provides a method of making a stacked microelectronic assembly. Preferred methods in accordance with this aspect of the invention include providing a flexible substrate having a plurality of attachment sites. The flexible substrate includes conductive terminals accessible at a surface thereof and wiring, such as one or more wiring layers, connected to the conductive terminals and having flexible leads extending to the attachment sites. The flexible substrate preferably includes a polymeric material and has a thickness of approximately between 25 and 75 microns. The wiring layer or layers typically include(s) a flexible electrically conductive metal, such as copper. In certain embodiments, the flexible substrate may include through vias extending from the first surface to the second surface thereof The through vias may include a conductive material for electrically interconnecting at least some of the flexible leads with the conductive terminals accessible at the one or more surfaces of the flexible substrate.

In the next stage of the process, a plurality of microelectronic elements are assembled to the attachment sites and electrically interconnected to the leads extending to the attachment sites. Each microelectronic element preferably includes a semiconductor chip having a front face with electrical contacts thereon and a back surface. During the assembly step, the front face of each chip is abutted with one of the attachment sites so that the electrical contacts on the semiconductor chip are aligned with the leads at the attachment sites. The conductive leads which extend to the attachment sites are electrically interconnected with the contacts using bonding techniques such as ultrasonic or thermocompression bonding or by using the bonding techniques disclosed in U.S. Pat. Nos. 5,398,863; 5,390,844; 5,536,909 and 5,491,302 the disclosures of which are incorporated by reference herein. The other ends of the flexible leads are connected to at least some of the conductive terminals accessible at one of the surfaces of the flexible substrate.

In certain embodiments, a plurality of compliant pads may be provided between the semiconductor chip and the attachment site. The compliant pads define channels running therebetween and preferably include a resilient material such as silicone. After the leads have been bonded to the contacts, a curable liquid encapsulant is then cured, such as by using heat, to provide a compliant interface between the chip and the flexible substrate.

Next, the flexible substrate is folded, preferably in an "S"-shaped or gentle zig-zag configuration, and at least some of the microelectronic elements assembled to the flexible substrate are stacked in vertical alignment with one another. During the vertical stacking stage, some of the microelectronic elements may be grouped in pairs and the paired microelectronic elements juxtaposed with one another. Preferably, during the juxtaposing step, the back surfaces of the paired microelectronic elements are positioned close to one another and most preferably are in contact with one another. By vertically aligning at least some of the microelectronic elements in close proximity with one another, the size of the stacked assembly will be minimized. After the flexible substrate is folded and the microelectronic elements are stacked, the conductive terminals of the flexible substrate are preferably exposed at the bottom of the stacked assembly for connecting the assembly with an external circuit element. The attachment sites of the flexible substrate should be spaced sufficiently apart so that the back surfaces of the paired microelectronic elements can be readily juxtaposed with one another during the folding and stacking steps without stretching or tearing the flexible substrate. In embodiments having two or more sets of paired microelectronic elements, the two or more sets preferably are stacked or aligned one atop the other in a substantially vertical alignment.

Before the stacked assembly is electrically interconnected with an external circuit element, such as a printed circuit board, the stacked pairs are typically secured or maintained in vertical alignment In one preferred embodiment, the stacked pairs are maintained in vertical alignment by providing a mechanical element which holds the stacked pairs in vertical alignment. The mechanical element may include a bracket which abuts against the top of the stacked microelectronic elements for holding the microelectronic elements in place and transferring heat from the top of the assembly. The mechanical element may include a thermally conductive material, such as a metal, for dissipating heat from the stacked microelectronic assembly. Preferably the mechanical element has openings in the side walls thereof or has no side walls at all so that cooling air may flow freely around the stacked pairs of microelectronic elements for holding the microelectronic elements in place and transferring heat from the top of the stack. The mechanical element may also include cooling fins at one or more surfaces thereof for dissipating heat from the chips.

Thermally conductive elements, such as flexible thermally conductive sheets including metal may be provided between the back surfaces of said paired microelectronic elements. The thermally conductive sheets transfer heat between the microelectronic elements to the top and the bottom of the stacked assembly. Moreover, the thermally conductive elements conduct heat laterally out of the stack. The thermally conductive sheets are also preferably in heat transfer relation with the mechanical element for transferring heat from the microelectronic elements to the mechanical element. For example, the conductive sheet may be in physical contact with the electrical element. In other embodiments, the paired microelectronic elements may be maintained in the back surface-to-back surface configuration by applying an adhesive, such as a thermally conductive adhesive, between the back surfaces of the paired microelectronic elements before the back surfaces are abutted against one another. The thermally conductive adhesive serves two purposes. First, it adheres the back surfaces of the paired microelectronic elements together to provide rigidity to the assembly and maintain the stacked microelectronic elements in vertical alignment. In addition the thermally conductive adhesive transfers heat between the stacked microelectronic elements so that heat can be dissipated from the top and/or the bottom of the assembly. Additional layers of the thermally conductive adhesive may also be applied between portions of the flexible substrate which are folded over upon itself during the stacking step to enhance heat transfer. Thus, the stacked microelectronic elements may be maintained in vertical alignment using the mechanical elements or the thermally conductive adhesive or a combination of both. In other embodiments, the adhesive may be applied between the back surfaces of only some of the paired microelectronic elements and/or some of the pairs of microelectronic elements.

The stacked assembly made in accordance with the various embodiments described above may then be electrically interconnected with an external circuit element, such as a printed circuit board, by electrically connecting the conductive terminals exposed at the bottom of the assembly to conductive pads on an external circuit element. As mentioned above, the flexible substrate is folded in such a manner that the conductive terminals are accessible at the bottom of the stacked assembly so that the stacked assembly can be readily interconnected to an external circuit element.

Assemblies fabricated according to the preferred embodiments of the present invention save valuable space on circuit boards because at least some of the chips are stacked vertically one atop the other rather than in a side-by-side configuration. The present invention also provides an inexpensive and economical means for manufacturing stacked assemblies. The aforementioned inventive methods and assemblies are preferably used to package memory devices such as a dynamic random access memory device ("DRAM") or other memory chips. Therefore, in preferred embodiments, the wiring layer will interconnect certain contacts on each of the semiconductor chips together in a bus configuration. Thus, corresponding contacts on each chip can be connected to the same lead. However, even in this configuration, the flexible leads may directly connect one or more of the individual microelectronic element contacts to a respective conductive terminal at one or more surfaces of the flexible substrate.

Another aspect of the present invention provides a stacked microelectronic assembly including a flexible substrate having a plurality of attachment sites. The flexible substrate includes conductive terminals accessible at a surface thereof and wring, such as one or more wiring layers, connected to the conductive terminals and including leads extending to the attachment sites. A plurality of microelectronic elements are assembled to the attachment sites and are electrically interconnected with the leads. The flexible substrate is folded for stacking at least some of the microelectronic elements in substantially vertical alignment with one another. A securing element, such as the mechanical element and/or the adhesive described above, maintains the stacked microelectronic elements in a substantially vertical alignment with one another whereby the conductive terminals are exposed at the bottom end of the assembly. In preferred embodiments, the second surface of the flexible substrate includes the conductive terminals which are electrically interconnected with at least some of the leads. However, in other embodiments, the conductive terminals may be provided at the first surface of the flexible substrate. After at least some of the microelectronic elements have been stacked in vertical alignment, the conductive terminals are electrically interconnected with an external circuit element as described above. The flexible substrate typically includes a polymeric material and has a thickness of between 25 to 75 microns and the wiring layer includes a flexible electrically conductive metal. Each of the microelectronic elements preferably includes a semiconductor chip having a front face with one or more electrical contacts thereon which are electrically interconnected with the leads at the attachment sites.

In another embodiment of the present invention, thermally conductive elements, preferably including a flexible metal sheet, are disposed between the back surfaces of at least some of the paired microelectronic elements in the assembly for transferring heat up and down the assembly. The ends of the thermally conductive sheets extending from the sides of the stack may also contact the mechanical element holding the chips in vertical alignment to transfer heat from the chips to the bracket, which in turn dissipates the heat from the stacked assembly. The ends of the thermally conductive sheets may also include flanges which contact the mechanical element. The flanges ensure a reliable contact between the conductive sheets and the mechanical element and increase the surface area for transferring heat therebetween.

In other embodiments, some of the microelectronic elements are stacked one atop the other in a vertical stack while other chips are stacked side-by-side. For example, first and second groups of microelectronic elements may be assembled to the flexible substrate so that the elements within any one group are in proximity with one another while the groups are spaced slightly apart from one another. The flexible substrate is then folded so that the back surfaces of the chips in the first group are in contact with the back surfaces of the chips in the second group. Although the chips within any one of the groups are side-by-side, by stacking one group atop another in vertical alignment, the final assembly saves valuable space on the circuit board. Also, the flex circuit is economical to manufacture compared with other more esoteric stacking package elements. In other embodiments, the stacked assembly may include a plurality of microelectronic elements stacked one atop the other in a vertical stack with one or more microelectronic elements positioned to the side of the vertical stack.

In another embodiment of the invention, some of the microelectronic elements are assembled to attachment sites at the first surface of the flexible substrate while other microelectronic elements are assembled to attachment sites at the second surface of the flexible substrate. The flexible substrate is then folded in an "S"-shaped or gentle zig-zag configuration to provide a stacked assemble whereby the chips are in substantial vertical alignment with one another. The flexible substrate may also be folded in a spiral configuration to provide a substantially vertical stack. The stack is preferably maintained in vertical alignment by using the thermally conductive adhesive and/or the mechanical element discussed above. The thermally conductive plates described above may be positioned between the microelectronic elements to transfer heat from between the chips and to the top and the bottom of the assembly.

In other embodiments, the conductive terminals can be accessible at either the first surface or the second surface of the flexible substrate. After the chips are assembled to the flexible substrate, the flexible substrate is folded so that the chips are in vertical alignment and so the conductive terminals are exposed at the bottom of the stack. It is critical that the conductive terminals be accessible at the bottom of the assembly so the assembly may be electrically connected to an external circuit element, such as a printed circuit board.

The stacked assemblies described in the above embodiments of the present invention provide economical and space saving structures for use in electronic devices. These and other objects features and advantages of the present invention will be more readily apparent from the description of the preferred embodiments set forth below and taken in conjunction with the accompanying drawings.

DETAILED DESCRIPTION OF PREFERRED EMBODIMENTS

Figure 1:
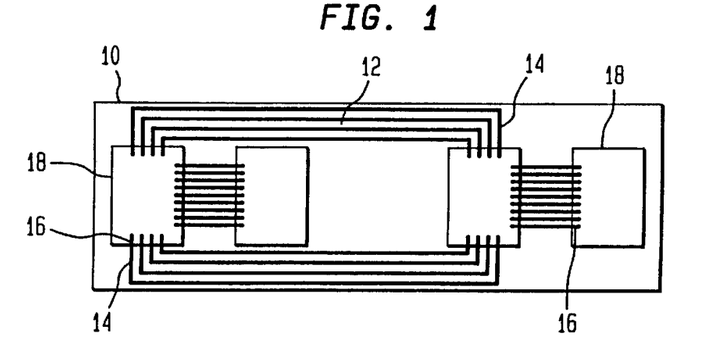
FIG. 1 shows a diagrammatic top view of one stage of a method of making a stacked microelectronic assembly in accordance with one embodiment of the invention.
Figure 2:
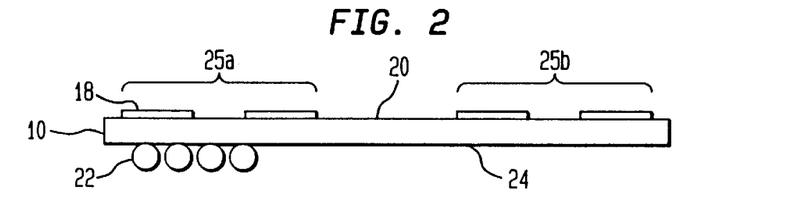
FIG. 2 shows a side view of FIG. 1.

As shown in FIGS. 1 and 2, a method in accordance with one embodiment of the present invention provides a flexible substrate 10 having a wiring layer 12 and including leads 14 having ends 16 extending to a plurality of attachment sites 18. The attachment sites 18 are shown as visible rectangular areas in FIG. 1 for clarity of illustration; however, in actual practice, the attachment sites 18 need not have visible borders. In addition, the thickness of the flexible substrate 10 shown in FIG. 2, as well as in subsequent figures, has been greatly exaggerated for clarity of illustration. The leads 14 preferably have connections sections configured for bonding at each attachment site. For example, the leads 14 may be of the type used in certain methods of tape automated bonding having frangible ends which are broken away from a bus bar during the bonding operation as disclosed in commonly assigned U.S. patent application Ser. No. 07/919,772, the disclosure of which is incorporated herein by reference. The plurality of attachment sites 18 and the ends 16 of the leads 14 extending to the attachment sites are provided at a first surface 20 of the flexible substrate 10. The attachment sites 18 are grouped in pairs 25A and 25B which are spaced on the flexible substrate 10 in a particular pattern for reasons which will be discussed in more detail below. The flexible substrate 10 includes conductive terminals 22 accessible at the second surface 24 thereof. The conductive terminals 22 are connected with the wiring layer 12 and at least some of the leads 14. In certain preferred embodiments, all of the leads 14 run to individual conductive terminals 22. Alteratively, in other preferred embodiments some of the leads 14 run between the chips 26 so that the number of conductive terminals 22 accessible at the second surface 24 of the flexible substrate 10 is less than the total number of chip contacts 30 and their corresponding leads 14. For example, the leads 14 could be bussed together or merely serve as common power/ground lines to each chip 26. The flexible substrate 10 is typically utilized to stack chip assemblies for memory devices such as a Dynamic Random Access Memory (DRAM) device or other memory chips.

Figure 3:
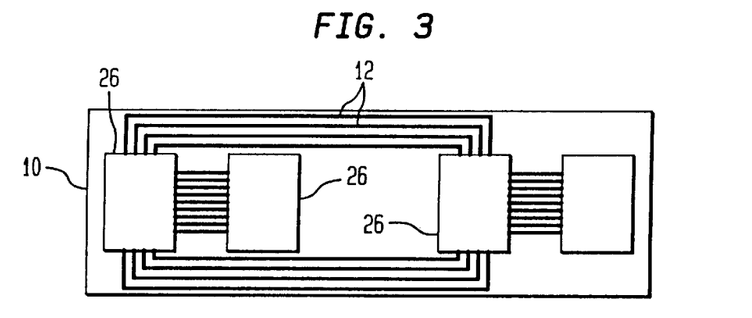
FIGS. 3–6 show still further stages of a method of making a stacked microelectronic assembly in accordance with one embodiment of the invention.
Figure 4A:
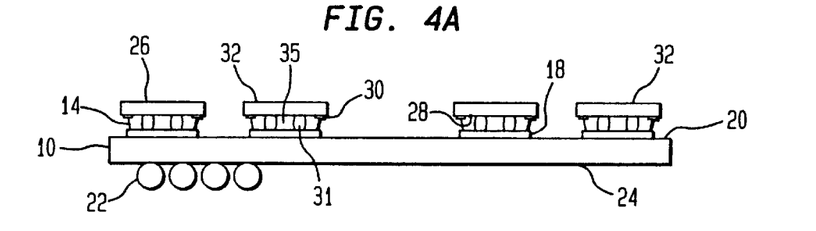
Figure 4B:
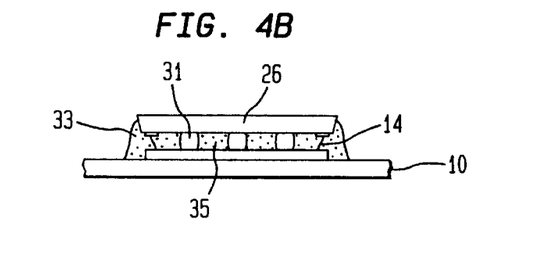

FIGS. 3 and 4A show a plurality of microelectronic elements 26 assembled to the attachment sites 18. Preferably, the chips are fully packaged prior to attachment to the "folding substrate." That way, if one chip is defectively packaged, the whole module need not be replaced. In one embodiment, each microelectronic element 26 preferably includes a semiconductor chip having a front face 28 with one or more electrical contacts 30 thereon. Each semiconductor chip 26 also includes a back surface 32. Before the chips 26 are assembled, a plurality of compliant pads 31 are provided over each attachment site 18. The compliant pads 31 define channels 35 running therebetween and the pads are similar to those disclosed in commonly assigned U.S. patent application Ser. No. 08/365,699, the disclosure of which is incorporated herein by reference. Next, the front face 28 of the semiconductor chip 26 is abutted against the compliant pads 31 at the attachment site 18 and the contacts 30 on the chip are aligned with the leads 14 extending to each attachment site. The leads 14 are then electrically interconnected with the contacts 30 by using the bonding techniques described above. After the semiconductor chips 26 have been assembled to the attachment sites 18 and bonded to the leads 14, the wiring layer 12 interconnects the semiconductor chips 26 with the conductive terminals 22 at the second surface 26 of the flexible substrate 20. Referring to FIG. 4B, a curable liquid encapsulant 33 is then applied around at least the perimeter of the chips 26 as disclosed in '699 application. The encapsulant 33 flows between the front face 28 of the chip 26 and the attachment site 18, through the channels 35 between the plurality of compliant pads 31 and around the leads 14 bonded to the contacts 30. The encapsulant 33 is then cured using energy, such as heat, to provide a compliant interface between the chip 26 and the flexible substrate 10. As mentioned previously, the wiring layer 12 interconnects some of the chips 12 together in a bus configuration because preferred embodiments of the stacked assembly will be used to package memory devices such as DRAMS. Even in this configuration, however, the leads 14 may directly connect one or more individual chips 26 to a conductive terminal 22.

Figure 5:
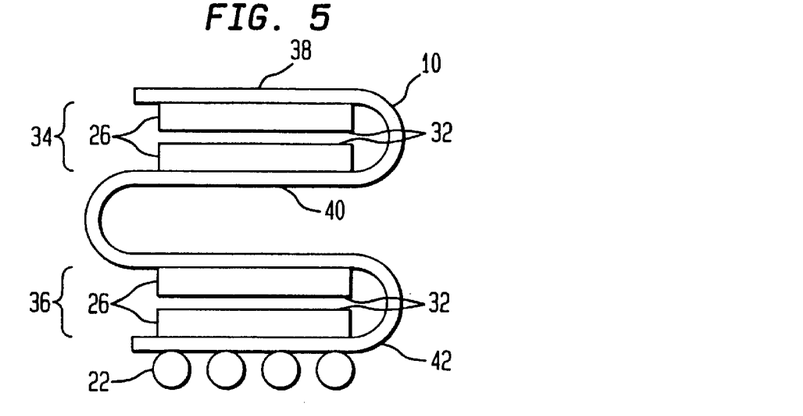

Referring to FIG. 5, the flexible substrate 10 is then folded in a gentle zig-zag or an "S" shaped pattern to stack the chips in vertical alignment with one another, whereby portions of the first surface 20 of the flexible substrate 10 bearing the attachment sites 18 face one another. During the folding step, the back surfaces 32 of paired semiconductor chips 26 are juxtaposed with one another. In order for the back surfaces 32 of the pairs of microelectronic elements 26 to be juxtaposed with one another without stretching or tearing the flexible substrate 10, the attachment sites 18 must be spaced sufficiently apart so that there is adequate slack in the flexible substrate 10 between the paired chips 26. The particular embodiment shown in FIG. 5 includes a first pair 34 of semiconductor chips 26 juxtaposed back-to-back to one another and sandwiched between a first section 38 of the flexible substrate 10. The flexible substrate 10 is then folded back over upon itself at an intermediate section 40 thereof, whereby portions of the flexible tape 10 are juxtaposed with one another. Next, the back surfaces 32 of a second pair 36 of semiconductor chips 26 are juxtaposed with one another. The final stacked assembly shown in FIG. 5 includes the first and second pairs 34 and 36 of chips 26 whereby the first pair 34 is provided over the second pair 36 and the two pairs 34 and 36 are substantially in vertical alignment with one another.

Figure 6:
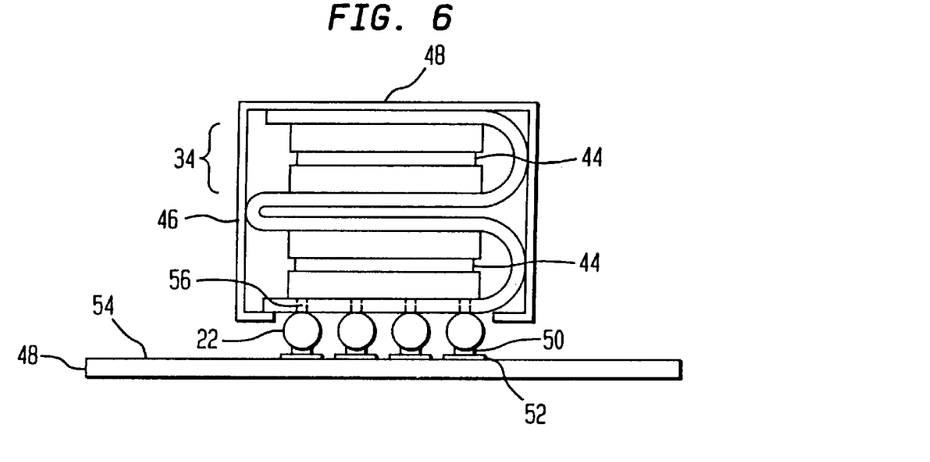

Referring to FIG. 6, in order to maintain the pairs 34 and 36 in vertical alignment an adhesive 44, such as a thermally conductive adhesive, is provided between the juxtaposed back surfaces 32 of the semiconductor chips 26 and is also provided between the portions of the flexible substrate which overlap one another, i.e., the intermediate section 40 of the flexible substrate 10. The adhesive 44 bonds the back surfaces of the juxtaposed chips 26 together to provide stability to the stacked assembly. The thermally conductive adhesive 44 also promotes even distribution of heat in the stacked chips 26, and thus limits the temperature rise in the hottest chips. The thermally conductive adhesive promotes conduction in the vertical direction within the stack; i.e., transfers the heat to the top and bottom of the stacked assembly for dissipation outside the assembly. To provide additional support for the assembly, a mechanical element 46, such as a bracket, is placed over the vertically aligned chips 26 so that the bracket 46 abuts against the top 48 of the aligned chips 26. Preferably, the bracket 46 does not include any side walls so that cooling air may freely interact with the exposed surfaces of the semiconductor chips 26. In other embodiments, the bracket 46 may include one or more side walls having openings therein for enabling cooling air to flow therethrough. As shown, the bracket 46 may also include cooling fins 47 on an exterior surface thereof for dissipating heat from the stacked assembly. The conductive terminals 22 are exposed at the bottom of the final assembly so that the chips 26 may be electrically interconnected with an external circuit element 48, such as a printed circuit board. Solder balls 50 are provided on the conductive terminals 22 for bonding the terminals 22 to conductive pads 52 located at a top surface 54 of the printed circuit board 48. In certain embodiments, the conductive terminals 22 are interconnected with the leads 14 through conductive vias 56 extending through the flexible substrate 10.

Figure 7:
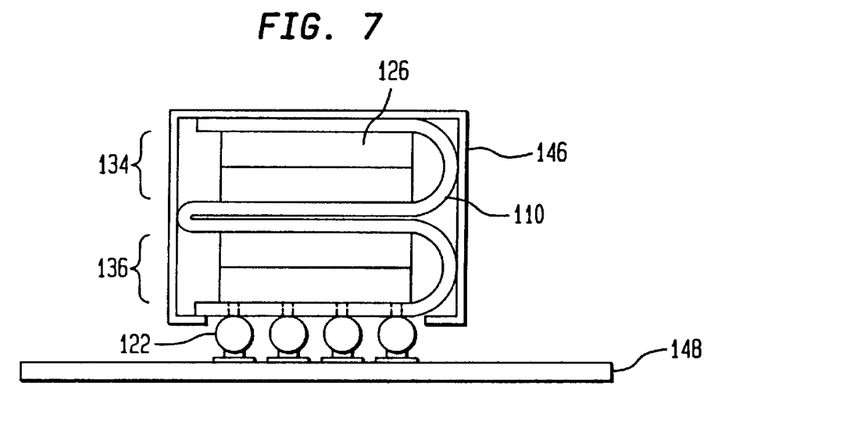
FIG. 7 shows a diagrammatic side view of a stacked assembly according to another embodiment of the present invention.

FIG. 7 shows another embodiment of the present invention wherein a thermally conductive adhesive is not used between the back surfaces of the pairs of chips 126. In this particular embodiment, the semiconductor chips 126 are assembled and electrically interconnected with the flexible substrate 110 as described above. The flexible substrate 110 is then folded so that the chips 126 are stacked in vertical alignment with one another and so that the back surfaces of pairs 134 and 136 are juxtaposed with one another. While the chips 126 are held in vertical alignment, a securing element 146, such as the bracket described above, is placed over the top of the stack. The securing element 146 abuts against the top of the stack to maintain the stacked assembly in vertical alignment. The assembly may then be electrically interconnected with an external circuit element 148 using the methods described above.

Figure 8:
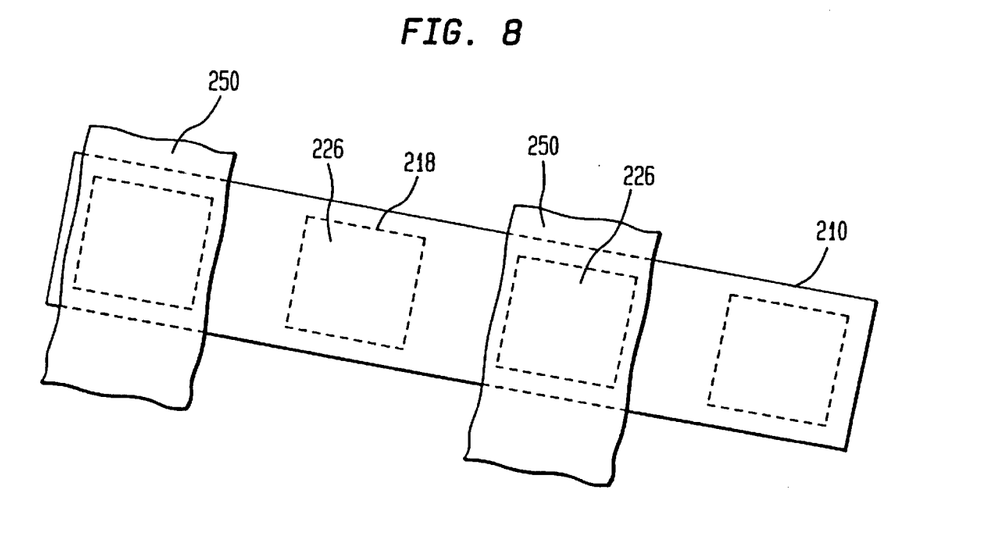
FIG. 8 shows a top view similar to FIG. 1 but depicting another embodiment of the present invention.
Figure 9:
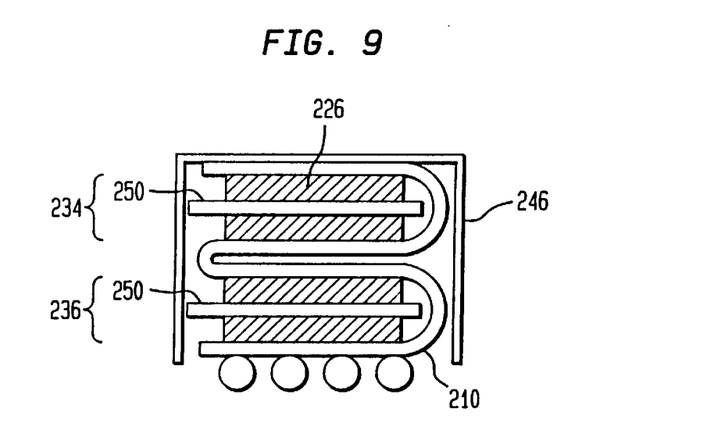
FIG. 9 shows a side view similar to FIG. 6 but depicting another embodiment of the present invention.

FIGS. 8 and 9 show another embodiment of the present invention whereby thermally conductive metallic plates 250 are attached to or merely disposed between the back surfaces of at least some of the semiconductor chips 226 to transfer heat from the chips 226 during operation. The thermally conductive plates 250 include flanges 252 at one end. The plates can be rigid or preferably flexible. Flexibility enhances engagement with the mechanical element 246. After the chips 226 have been assembled to the attachment sites 218, the flexible metal sheets 250 may be attached to the back surfaces of the chips 226 using an adhesive such as thermally conductive adhesive 244. Alternatively, the flexible metal sheets 250 may be placed between the back surfaces of the chips 226 without using the adhesive. Referring to FIG. 9, the flexible substrate 210 is then folded in an "S"-shaped configuration as described above so as to provide a stacked assembly whereby the flexible metal sheets 250 are between the back surfaces of the pairs of chips 234, 236 for transferring heat from the assembly. Preferably, the flexible metal sheets 250 extend to one or more sides of the stack for transferring heat from the chips 226. The flanges 252 at the end of the flexible metal plates 250 are preferably in direct contact with a mechanical element 246 to transfer heat from the chips 226 to the bracket 246, which in turn dissipates heat from the stacked assembly. Alternatively, a thermally conductive material can be provided between the flanges 250 and the bracket 246. In further embodiments, the flexible metal sheets 250 are first attached to the bracket 246 before the flexible substrate 210 is folded, whereby the flexible metal sheets 250 are passed between the back surfaces of the chips 226 as the chips are stacked in vertical alignment.

Figure 10:
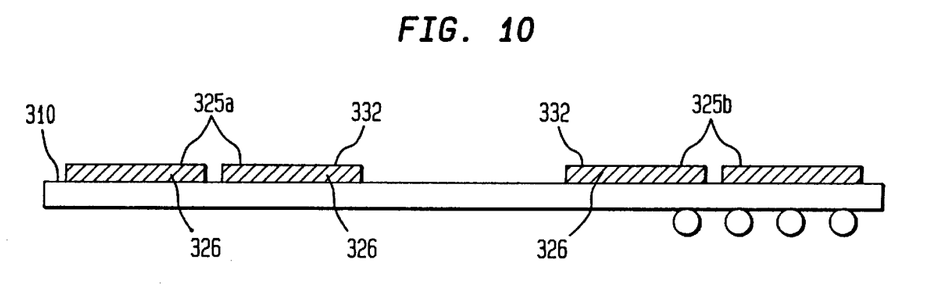
FIG. 10 shows a side view similar to FIG. 4A but depicting another embodiment of the present invention.
Figure 11:
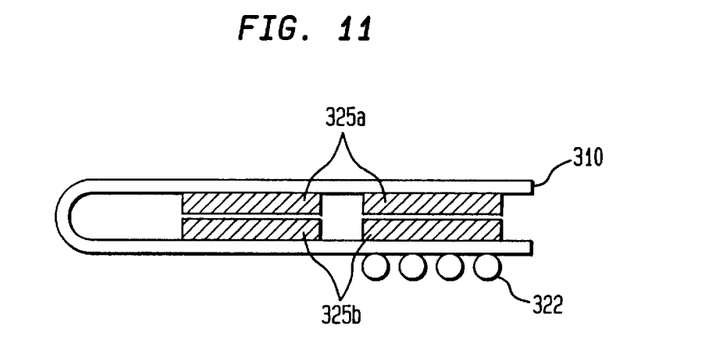
FIG. 11 shows a side view similar to FIG. 5 but depicting another embodiment of the present invention.

FIGS. 10 and 11 show further embodiments of the present invention whereby chips 326 are stacked in both vertical alignment and side-by-side. For example, first and second groups of microelectronic elements 325A, 325B are assembled to the flexible substrate 310 so that the chips 326 within the respective first and second groups 325A, 325B are in close proximity with one another. As shown in FIG. 11, the flexible substrate 310 is folded over so that the back surfaces 332 of the chips 326 in the first group 325A are in contact with the back surfaces 332 of the chips 326 in the second group 325B. Thus, although the chips 326 in any one group are disposed side-by-side, the chips in the different groups are stacked in vertical alignment one atop the other, to provide a stacked assembly which will save space on a circuit board.

Figure 12:
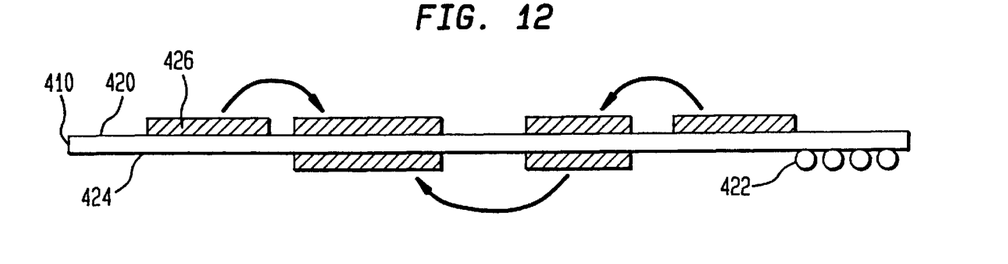
FIGS. 12 and 13 show views similar to FIGS. 10 and 11, respectively, but depicting still further embodiments of the present invention.
Figure 13:
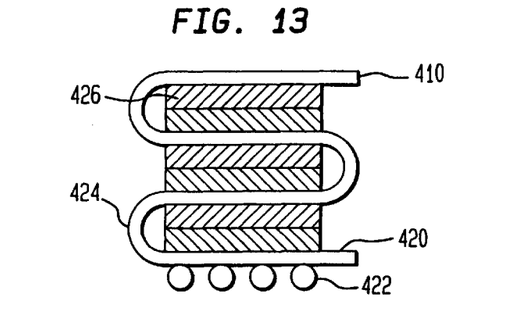

FIGS. 12 and 13 show still further embodiments of the present invention whereby some of the chips 426 are assembled to the first surface 420 of the flexible substrate 410 and some of the chips 426 are assembled to the second surface 424 of the flexible substrate 410. Referring to FIG. 13, the flexible substrate 410 is then folded in an "S"-shaped or gentle zig-zag configuration to provide a stacked assembly whereby the chips are in substantial vertical alignment with one another. The stack is maintained in vertical alignment using the thermally conductive adhesive and/or the mechanical element discussed above. Flexible metal sheets (not shown) may be placed between the microelectronic elements to transfer heat from the chips, as described above.

Figure 14:
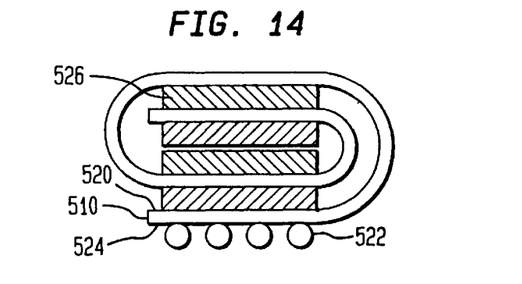
FIGS. 14 and 15 show yet further embodiments of the present invention wherein the assembly has a spiral configuration.
Figure 15:
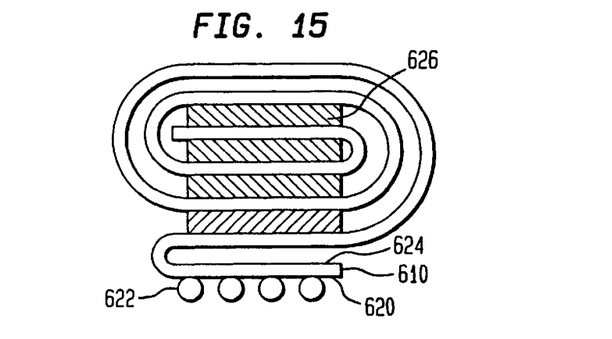

Referring to FIGS. 14 and 15, in yet further embodiments, the conductive terminals can be accessible at either the first surface or the second surface of the flexible substrate. After the chips are assembled to the flexible substrate, the flexible substrate is folded so that the conductive terminals are exposed at the bottom of the stack so the assembly may be electrically connected to an external circuit element, such as a printed circuit board. FIG. 14 shows a flexible substrate 510 having the chips 526 assembled to both the first and second surfaces 520, 524 of the flexible substrate 510 and the conductive terminals 522 being accessible at the second surface 524 of the flexible substrate 510. FIG. 15 shows another embodiment whereby a flexible substrate 610 has chips assembled to both the first and the second surfaces 620, 624 of the flexible substrate 610; however, the conductive terminals 622 are accessible at the first surface 620 of the flexible substrate 610. In this particular embodiment, an extra fold is provided in the flexible substrate 610 when forming the stacked assembly so that the conductive terminals 622 are exposed at the bottom of the assembly.

Figure 16:
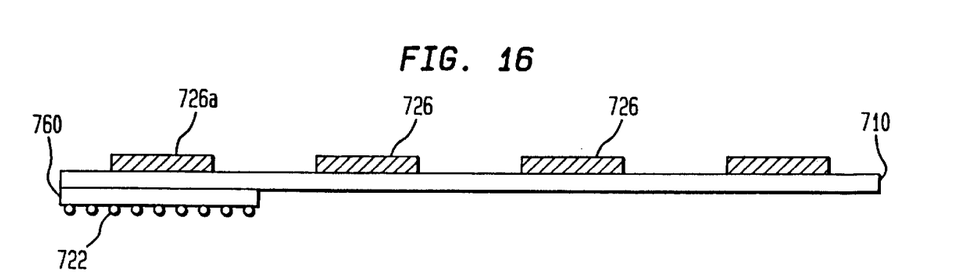
FIGS. 16 and 17 show views similar to FIGS. 12 and 13, respectively, but depicting further embodiments of the present invention.
Figure 17:
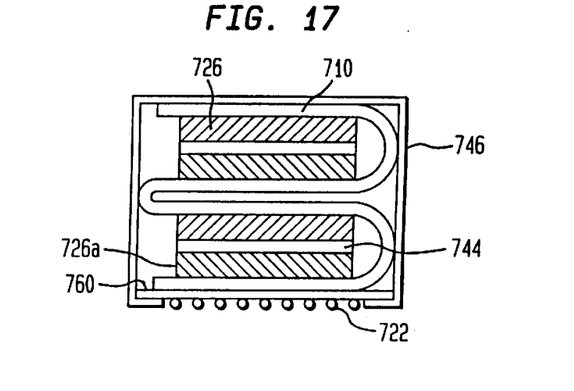

FIGS. 16 and 17 show yet other embodiments of the present invention whereby a large number of conductive terminals 722 are accessible at a surface of the flexible substrate 710. In certain embodiments, the number of conductive terminals 722 may be so large that the chip 726a overlying the conductive terminals 722 may not provide sufficient support for the conductive terminals 722. For example, in FIG. 5 the conductive terminals 22 are adequately supported by the semiconductor chip 26 at the bottom of the stacked assembly because the conductive terminals 22 do not extend beyond the periphery of the chip 26. In contrast, the conductive terminals 722 in FIG. 16 extend beyond the periphery of the semiconductor chip 726a. As such, is order to adequately support the conductive terminals 722 beyond the periphery of the chip 726a, the flexible substrate 710 includes a rigid element 760 which provides rigidity to the bottom of the assembly when the chips 726 are stacked in substantially vertical alignment, as shown in FIG. 17. The outer perimeter of the rigid element 760 may include slots or other elements for connecting the rigid element 760 to the mechanical element 746. As shown in FIG. 17, the perimeter of the rigid element 760 is in contact with inwardly extending flanges at the bottom of the bracket 746 so that the stacked assembly is adequately secured within the bracket 746.

Figure 18:
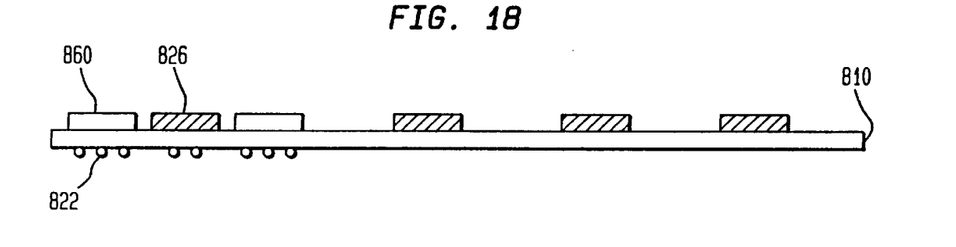
FIGS. 18 and 19 show views similar to FIGS. 16 and 17, respectively, but depicting further embodiments of the present invention.
Figure 19:
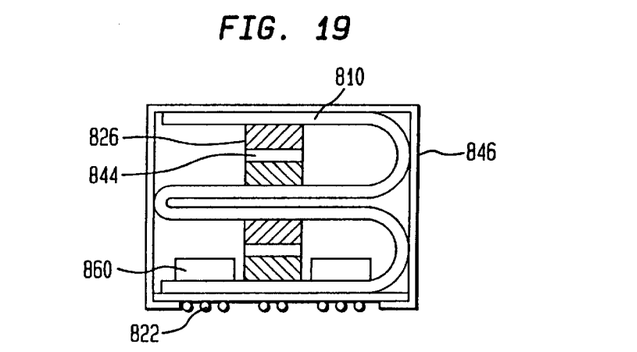

FIGS. 18 and 19 show still further embodiments of the present invention whereby the conductive terminals 822 at the bottom of the stacked assembly are supported by a ring 860, such as metallic ring, positioned around a chip 826. The ring 860 provides support for any of the conductive terminals 822 which are located outside the periphery of the chip 826 at the bottom of the stacked assembly.

As will be appreciated, numerous variations and combinations of the features discussed above can be utilized without departing from present invention as defined by the claims. For example, the embodiments shown in FIGS. 1–6 depict a stacked microelectronic assembly which is four chips high, however, more chips or fewer chips may be used in accordance with the chip stacking methods of the present invention. Accordingly, the foregoing description of the preferred embodiments should be taken by way of illustration rather than by way of limitation of the present invention.

I claim:

1. A method of making a stacked microelectronic assembly comprising:
   a) providing a flexible substrate having a plurality of attachment sites, said flexible substrate including conductive terminals accessible at a surface thereof and wiring connected to said terminals and including flexible leads extending to said attachment sites;
   b) providing compliant elements atop said attachment sites;
   c) assembling a plurality of microelectronic elements to said attachment sites, wherein said compliant elements are disposed between said microelectronic elements and said attachment sites;
   d) electrically connecting said microelectronic elements and said flexible leads, wherein said electrically connected microelectronic elements are movable relative to said flexible substrate;

e) folding said flexible substrate and stacking at least some of said microelectronic elements in substantially vertical alignment with one another;

f) maintaining said stacked microelectronic elements in said substantially vertical alignment, wherein said conductive terminals are exposed at a bottom end of said stacked assembly.

2. A method as claimed in claim 1, wherein said flexible substrate includes a polymeric material and has a thickness between approximately 25 to 75 microns.

3. A method as claimed in claim 1, wherein said wiring layer interconnects at least some of said microelectronic elements with one another.

4. A method as claimed in claim 1, wherein said microelectronic elements include a memory chip.

5. A method as claimed in claim 1, further comprising the step of connecting said conductive terminals with an external circuit element for interconnecting said microelectronic elements and said circuit element.

6. A method as claimed in claim 5, wherein the assembling step includes aligning the contacts on the front face of said microelectronic element with said leads at said attachment site and abutting the front face of said microelectronic element against said attachment site.

7. A method as claimed in claim 6, further comprising the step of providing a plurality of compliant pads between the front face of said microelectronic element and said attachment site before the assembling step, said compliant pads defining channels therebetween.

8. A method as claimed in claim 7, further comprising allowing a curable liquid encapsulant to flow between said microelectronic element and said attachment site and through said channels between said compliant pads and curing said encapsulant to provide a compliant interface between said microelectronic element and said attachment site.

9. A method as claimed in claim 1, wherein the stacking step includes the step of grouping said at least some of said microelectronic elements in pairs and juxtaposing said paired microelectronic elements with one another.

10. A method as claimed in claim 9, wherein each said microelectronic element includes a front face bearing contacts and a back surface, each said microelectronic element being assembled to the substrate with its front face being toward the attachment site and its back surface facing away from the attachment site.

11. A method as claimed in claim 10, wherein the juxtaposing step includes the step of abutting said back surfaces of said paired microelectronic elements with one another.

12. A method as claimed in claim 11, wherein the maintaining step includes the step of applying an adhesive between the back surfaces of said paired microelectronic elements before the abutting step.

13. A method as claimed in claim 12, wherein said adhesive includes a thermally conductive material.

14. A method as claimed in claim 12, wherein the maintaining step includes the further step of applying an adhesive to said flexible substrate.

15. A method as claimed in claim 14, wherein said adhesive includes a thermally conductive material.

16. A method as claimed in claim 14, wherein the maintaining step includes the further step of providing a mechanical element in contact with said stacked microelectronic elements.

17. A method as claimed in claim 16, wherein said mechanical element includes a bracket abutting against the top of said stacked microelectronic elements.

18. A method as claimed in claim 11, wherein the maintaining step includes the step of providing a mechanical element holding with said stacked microelectronic elements in vertical alignment.

19. A method as claimed in claim 18, wherein said mechanical element includes a bracket abutting against the top of said stacked microelectronic elements.

20. A method as claimed in claim 19, wherein said mechanical element includes a thermally conductive material.

21. A method as claimed in claim 20, further comprising the step of providing thermally conductive sheets between the back surfaces of said paired microelectronic elements.

22. A method as claimed in claim 21, said thermally conductive sheets being in heat transfer communication with said mechanical element for transferring heat from said microelectronic elements.

23. A stacked microelectronic assembly comprising:

a flexible substrate having a plurality of attachment sites, said flexible substrate including conductive terminals accessible at a surface thereof and wiring connected to said terminals and including flexible leads extending to said attachment sites;

a plurality of microelectronic elements assembled to said attachment sites and electrically connected to said leads, compliant elements disposed between said microelectronic elements and said attachment sites wherein said electrically connected microelectronic elements are movable relative to said flexible substrate after said compliant elements have been disposed therebetween;

said flexible substrate being folded so that at least some of said microelectronic elements are stacked in substantially vertical alignment with one another; and a securing element maintaining said stacked microelectronic elements in substantially vertical alignment with one another, wherein said conductive terminals are exposed at a bottom end of said assembly.

24. An assembly as claimed in claim 23, wherein said flexible substrate includes a polymeric material and has a thickness between approximately 25 and 75 micros.

25. An assembly as claimed in claim 23, wherein each said microelectronic element includes a semiconductor chip.

26. An assembly as claimed in claim 23, wherein said wiring layer interconnects at least some of said microelectronic elements with one another.

27. An assembly as claimed in claim 23, wherein said flexible substrate includes a substantially S-shaped pattern.

28. An assembly as claimed in claim 23, wherein said flexible substrate includes a substantially spiral pattern.

29. An assembly as claimed in claim 23, further comprising a rigid element substantially coextensive with said conductive terminals, said rigid element support said conductive terminals at the bottom of said assembly.

30. An assembly as claimed in claim 23, wherein said conductive terminals are electrically connected to at least some of said leads.

31. An assembly as claimed in claim 30, wherein said conductive terminals are electrically interconnected to an external circuit element for interconnecting said microelectronic elements and said external circuit element.

32. An assembly as claimed in claim 23, further comprising a resilient element between the front face of each said microelectronic element and each said attachment site.

33. An assembly as claimed in claim 32, wherein said resilient element includes a plurality of compliant pads defining channels therebetween.

34. An assembly as claimed in claim 23, wherein each said microelectronic element includes a front face bearing contacts and a back surface facing away from said attachment site.

35. An assembly as claimed in claim 34, wherein at least some of said stacked microelectronic elements are grouped in pairs, the back surfaces of said paired microelectronic elements being juxtaposed with one another.

36. An assembly as claimed in claim 35, wherein said securing element includes an adhesive between the back surfaces of said paired microelectronic elements.

37. An assembly as claimed in claim 36, wherein said adhesive is between overlapping sections of said flexible substrate.

38. An assembly as claimed in claim 35, wherein said securing element includes a mechanical element including a thermally conductive material, said mechanical element abutting against the top of said stacked microelectronic elements.

39. An assembly as claimed in claim 38, wherein said mechanical element includes cooling fins on a surface thereof for dissipating heat therefrom.

40. An assembly as claimed in claim 38, wherein said mechanical element comprises a bracket.

41. An assembly as claimed in claim 38, further comprising thermally conductive sheets between said back surfaces of said paired microelectronic elements.

42. An assembly as claimed in claim 41 said thermally conductive sheets being in heat transfer communication with said mechanical element for transferring heat from said microelectronic elements to said mechanical element.

* * * * *